United States Patent
Lin et al.

(10) Patent No.: US 8,932,916 B2
(45) Date of Patent: Jan. 13, 2015

(54) METHOD FOR FABRICATING THIN-FILM TRANSISTOR

(71) Applicant: National Chiao Tung University, Hsinchu (TW)

(72) Inventors: Horng-Chih Lin, Hsinchu (TW); Rong-Jhe Lyu, Taichung (TW)

(73) Assignee: National Chiao Tung University, Hsinchu (TW)

( * ) Notice: Subject to any disclaimer, the term of this patent is extended or adjusted under 35 U.S.C. 154(b) by 0 days.

(21) Appl. No.: 14/075,039

(22) Filed: Nov. 8, 2013

(65) Prior Publication Data
US 2014/0357017 A1     Dec. 4, 2014

(30) Foreign Application Priority Data
May 31, 2013   (TW) .............................. 102119402 A

(51) Int. Cl.
*H01L 21/00*     (2006.01)
*H01L 29/66*     (2006.01)

(52) U.S. Cl.
CPC ................................ *H01L 29/66969* (2013.01)
USPC ..................... 438/151; 438/163; 257/E21.414

(58) Field of Classification Search
USPC ....................................................... 257/E21.4
See application file for complete search history.

(56) References Cited

U.S. PATENT DOCUMENTS
2005/0077523 A1*   4/2005   Ahn et al. ......................... 257/72

OTHER PUBLICATIONS

Aixia Lu, Jia Sun, Jie Jiang, and Qing Wan; One-Shadow-Mask Self-Assembled Ultralow-Voltage Coplanar Homojunction Thin-Film Transistors; IEEE Electron Device Letters, vol. 31, No. 10, Oct. 2010, pp. 1137-1139.
Horng-Chih Lin; Rong-Jhe-Lyu; Tiao-Yuan Huang; Fabrication of High-Performance ZnO Thin-Film Transistors with Submicrometer Channel Length; IEEE Electron Device Letters, vol. 34, No. 9, Sep. 2013, pp. 1160-1162.
Rong-Jhe Lyu, Horng-Chih Lin, Tiao-Yuan Huang, "Fabrication and Characterization of High-Performance ZnO Thin-Film Transistors", published at the 2013 International Conference program held between Sep. 24 and Sep. 27, 2013.

* cited by examiner

*Primary Examiner* — Cheung Lee
(74) *Attorney, Agent, or Firm* — Rosenberg, Klein & Lee

(57) ABSTRACT

A method for fabricating a thin-film transistor is disclosed. Firstly, a patterned dielectric mask structure with a bottom thereof having a gate dielectric layer is formed on a gate-stacked structure so that the gate dielectric layer covers a gate of the gate-stacked structure. Top surface of the patterned dielectric mask structure has at least two openings. A semiconductor layer is formed on the gate-stacked structure via the openings by a sputtering method. The semiconductor layer comprises a channel above the gate, a source and a drain below the openings. The channel has a thickness which sequentially decreases from edge to center.

16 Claims, 18 Drawing Sheets

METHOD FOR FABRICATING THIN-FILM TRANSISTOR

This application claims priority for Taiwan patent application no. 102119402 filed at May 31, 2013, the content of which is incorporated by reference in its entirety.

BACKGROUND OF THE INVENTION

1. Field of the Invention

The present invention relates to a technology for fabricating a transistor, particularly to a method for fabricating a thin-film transistor.

2. Description of the Related Art

In recent years, applications of flat display devices are rapidly developed. Electronics, such as televisions, cell phones, mobiles, and refrigerators, are installed with flat display devices. A thin film transistor (TFT) is a kind of semiconductor devices commonly used in the flat display device, such as a liquid crystal display (LCD), an organic light emitting diode (OLED) display, and an electronic paper (E-paper). The thin film transistor is employed to control voltage and/or current of a pixel of the flat display device for presenting a bright, a dark, or a gray level display effect.

According to different semiconductor materials applied in the thin film transistors, the thin film transistors in current display industries may includes amorphous silicon thin film transistors (a-Si TFTs), poly silicon thin film transistors, and oxide semiconductor thin film transistors. The amorphous silicon thin film transistor is currently the mainstream thin film transistor applied in the display industry because of its mature process techniques and high yield. However, the amorphous silicon thin film transistor may not be good enough to satisfy requirements of foreseeable high performance display devices, because the electrical mobility of the amorphous silicon thin film transistor, which is mainly determined by material properties of amorphous silicon, can not be effectively improved by process tuning or design modification. The typical value of the electrical mobility of the amorphous silicon thin film transistor is smaller than 1 $cm^2/Vs$. On the contrary, the electrical mobility of the poly silicon thin film transistor is much better because of material properties of poly silicon. The typical value of the electrical mobility of the poly silicon thin film transistor is around 100 $cm^2/Vs$. However, because of process issues such as high process complexity and worse uniformity, which is mainly generated by crystallization processes applied to large size substrates, the poly silicon thin film transistors are mainly applied in small size display devices. On the other hand, the oxide semiconductor thin film transistor may be applied for large size substrates without the above-mentioned uniformity issue because the structure of the employed oxide semiconductor material is generally amorphous. The process flexibility of the oxide semiconductor thin film transistor is even better than the amorphous silicon thin film transistor, because the oxide semiconductor material layer may be formed by diverse methods such as sputter depositing, spin-on coating, and ink-jet printing. Additionally, the electrical mobility of the oxide semiconductor thin film transistor is generally 10 times larger than the electrical mobility of the amorphous silicon thin film transistor. The typical value of the electrical mobility of the oxide semiconductor thin film transistor is generally between 10 and 50 $cm^2/Vs$. Therefore, the oxide semiconductor thin film transistor is currently the front-runner in the competition of replacing the amorphous silicon thin film transistor in the display industry.

In the traditional technology, as shown in FIG. 1, a gate layer 12 and a gate oxide layer 14 are sequentially formed on a plastic substrate 10, and the gate oxide layer 14 is made of porous silicon oxide. A nickel shadow mask 16 with a pair of holes 17 is used to undertake a patterned process. An ITO layer as a source 18 and a drain 20 is deposited on the gate oxide layer 14 via the holes 17 by a sputtering method. The shadow mask 16 is about 50 μm from the plastic substrate 10, and the shadow mask 16 and the plastic substrate 10 are separated. In the sputtering process, a channel 22 is formed between the source 18 and the drain 20 due to a scattering effect since the shadow mask 16 is a distance from the plastic substrate 10. However, the patterned process of using the shadow mask 16 fails to fabricate the channel with the very short width (only ≥50 μm). Besides, the distance between the shadow mask 16 and the plastic substrate 10 is not precisely controlled taking a consideration of bending of the shadow mask 16 and the plastic substrate 10 themselves, thereby not precisely controlling the uniformity and the size of devices. As a result, the traditional technology is difficult to fabricate circuits.

To overcome the abovementioned problems, the present invention provides a method for fabricating a thin-film transistor, so as to solve the afore-mentioned problems of the prior art.

SUMMARY OF THE INVENTION

A primary objective of the present invention is to provide a method for fabricating a thin-film transistor, which forms a patterned dielectric mask structure on a gate-stacked structure, thereby forming a channel, a source and a drain which are all coplanar, and which fabricates the deep sub-micrometer transistors with good uniformity and more process flexibility, and which favors to fabricate panels and chips.

To achieve the abovementioned objectives, the present invention provides a method for fabricating a thin-film transistor. Firstly, a patterned dielectric mask structure is formed on a gate-stacked structure to cover a gate of the gate-stacked structure. A top surface of the patterned dielectric mask structure has at least two openings which are respectively positioned above two areas at two opposite sides of the gate. Then, a semiconductor layer is formed on the patterned dielectric mask structure through the openings. The semiconductor layer comprises a channel above the gate, a source and a drain. The source and the drain are respectively positioned at two opposite sides of the channel, and the channel has a thickness which sequentially decreases from edge to center. Furthermore, respective electrodes are formed on the surface of the semiconductor source and drain regions.

Below, the embodiments are described in detail in cooperation with the drawings to make easily understood the technical contents, characteristics and accomplishments of the present invention.

DETAILED DESCRIPTION OF THE INVENTION

The present invention uses a low cost and simple process compatible to the semiconductor process and equipments in existence to fabricate thin-film transistors having high-repeat and massively-produced properties. In addition, the present invention applies to fabricate panels and chips.

Figure 1:
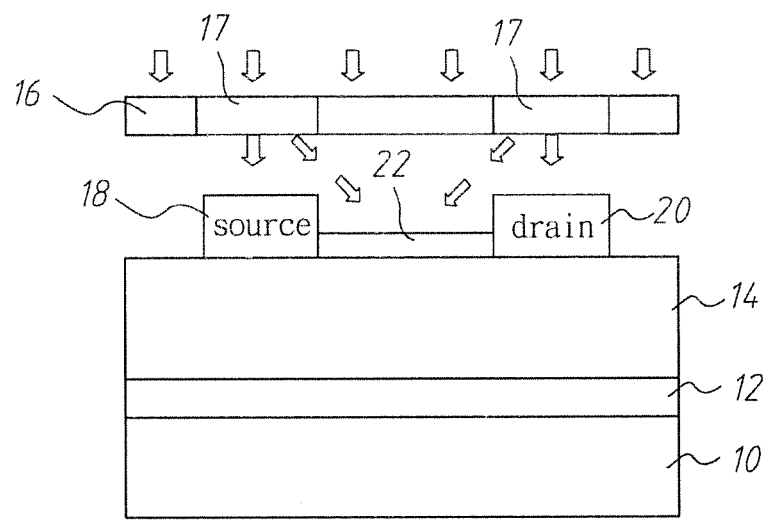
FIG. 1 is a diagram schematically showing a thin-film transistor in the traditional technology.
Figure 2:
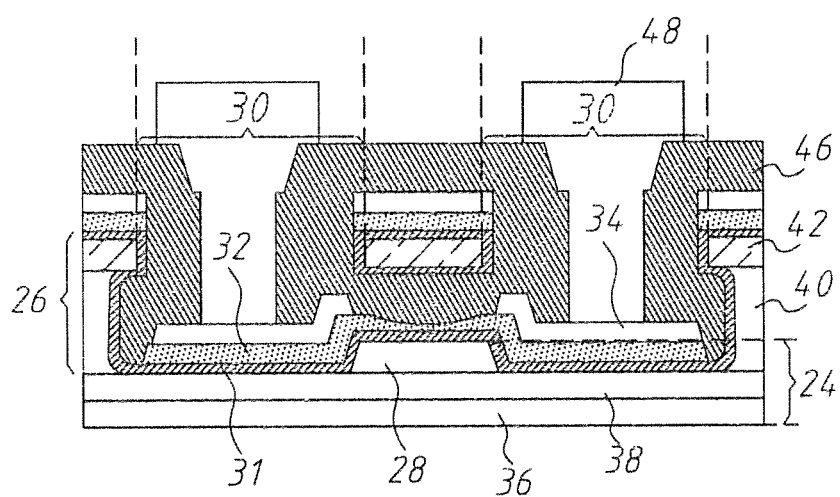
FIG. 2 is a sectional view schematically showing a thin-film transistor according to the first embodiment of the present invention.

The first embodiment of the present invention is introduced as below. Refer to FIG. 2. The first embodiment applies to fabricate panels. The present invention comprises a gate-stacked structure 24. A patterned dielectric mask structure 26 is formed on the gate-stacked structure 24 to cover a gate 28 of the gate-stacked structure 24. A top surface of the patterned dielectric mask structure 26 has at least two openings 30. A bottom of the patterned dielectric mask structure 26 has a gate dielectric layer 31 covering the gate 28. A semiconductor layer 32 is formed on the gate dielectric layer 31 and comprises a channel above the gate 28, a source and a drain. The source and the drain are respectively positioned at two opposite sides of the channel. The channel connects with the source and the drain which are respectively positioned below the openings 30. The channel has a thickness which sequentially decreases from edge to center. The semiconductor layer 32 comprises metal oxide, such as Zinc Oxide (ZnO) or Indium Gallium Zinc Oxide (IGZO). Two electrode blocks 34 are respectively formed on the source and the drain to reduce parasitic resistance. Material of the electrode blocks 34, for example, but not limited to aluminum, is used.

The gate-stacked structure 24 further comprises a substrate 36 and an insulation layer 38 thereon. The gate 28 is formed on the insulation layer 38. The patterned dielectric mask structure 26 further comprises a patterned sacrifice layer 40 formed on the insulation layer 38 of the gate-stacked structure 24 and surrounding the gate 28. A hard mask layer 42 with two openings 30 is formed on the patterned sacrifice layer 40. Material of the hard mask layer 42, for example, but not limited to nitride, is used. The gate dielectric layer 31 is formed on the surfaces of the insulation layer 38 and the gate 28 of the gate-stacked structure 24, the patterned sacrifice layer 40 and the hard mask layer 42. The semiconductor layer 32 is formed on the gate dielectric layer 31. A protection layer 46 is formed on the electrode blocks 34, the semiconductor layer 32 and the gate dielectric layer 31 of the patterned dielectric mask structure 26 to expose parts of the two electrode blocks 34. At least one conduction structure 48 is formed on the protection layer 46 to connect with the electrode blocks 34. At least one conduction structure 48 is exemplified by two conduction structure 48.

Figure 3A:
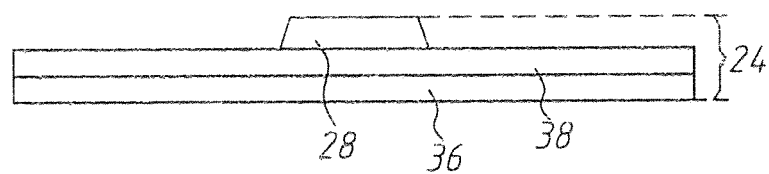
FIGS. 3(a)-3(h) are sectional views schematically showing the steps of fabricating the thin-film transistor according to the first embodiment of the present invention.
Figure 3B:
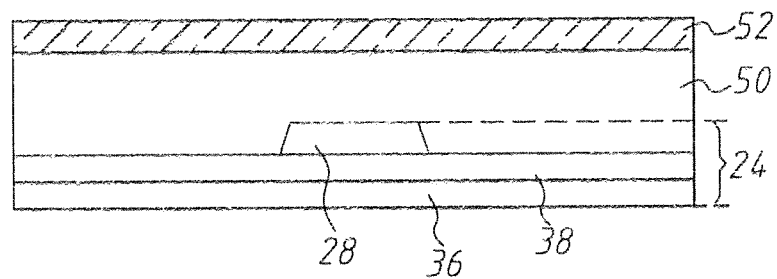

The process for fabricating the first embodiment is introduced as below. Refer to FIGS. 3(a)-3(h). Firstly, as shown in FIG. 3(a), the insulation layer 38 and the gate 28 are sequentially formed on the substrate 36 to obtain the gate-stacked structure 24. Next, as shown in FIG. 3(b), a sacrifice layer 50 and a hard mask layer 52 are sequentially formed on the insulation layer 38 of the gate-stacked structure 24 and the gate 28. Then, the hard mask layer 52 is etched to have the two openings 30 by a dry etching method, thereby forming the hard mask layer 42 shown in FIG. 3(c). Also, the sacrifice layer 50 below the openings 30 and above the gate 28 is removed by a wet etching method and isotropic etching to expose the gate 28, thereby forming the patterned sacrifice layer 40 shown in FIG. 3(c). FIG. 4 shows a top view of the hard mask layer 42, wherein a cantilever between the two openings 30 has a length L and a width W which are respectively defined as a length and a width of a channel of a transistor. A distance between the cantilever and the substrate 36 is defined as H, L/H is about 1~2. Then, as shown in FIG. 3(d), the surfaces of the insulation layer 38 and the gate 28 of the gate-stacked structure 24, the patterned sacrifice layer 40 and the hard mask layer 42 are covered with the gate dielectric layer 31, such that the patterned dielectric mask layer 26 is formed on the gate-stacked structure 24. The gate dielectric layer 31 is formed by chemical vapor deposition (CVD) or atomic layer deposition (ALD). Then, as shown in FIG. 3(e), the semiconductor layer 32 is formed on the gate dielectric layer 31 of the patterned dielectric mask structure 26 through the openings 30 by a sputtering method under a pressure between $10^{-3}$~$10^{-2}$ torr. The semiconductor layer 32 comprises a channel above the gate 28, a source and a drain. The source and the drain are respectively positioned at two opposite sides of the channel. The channel has a thickness which sequentially decreases from edge to center. Due to the scattering effect, the channel is formed below the cantilever of the hard mask layer 42 to connect with the source and the drain. Then, as shown in FIG. 3(f), the two electrode blocks 34 are respectively formed on the source and the drain through the openings 30 by a thermal evaporation method under a pressure lower than $10^{-5}$ torr, a collimating sputtering method or an ionized metal plasma sputtering method. Due to the fact that the pressure is low enough or the deposit has verticality properties, the film formed below the cantilever is opened. Then, as shown in FIG. 3(g), the protection layer 46 is formed on the two electrode blocks 34, the semiconductor layer 36 and the gate dielectric layer 31 of the patterned dielectric mask structure 26 to expose the parts of the two electrode blocks 34. Finally, as shown in FIG. 3(h), the conduction structures 48 are formed on the protection layer 46 to connect with the two electrode blocks 34. Since the patterned dielectric mask structure 26 is directly formed on the gate-stacked structure 24, the channel, the source and the drain are formed in a self-assembled way without considering the problem of bending of the mask structure and the substrate themselves, thereby precisely controlling the size of the element. In addition, the process of the present invention is not only simple and compatible to the traditional technology but easily achieves the purpose of deep sub-micrometer size, high uniformity and more process flexibility.

Figure 3C:
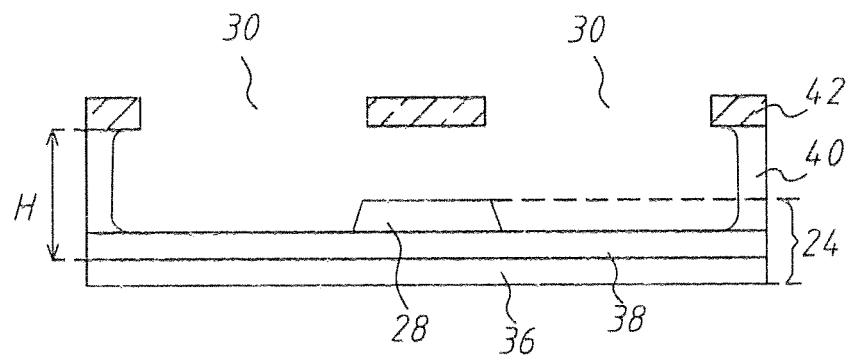
Figure 3D:
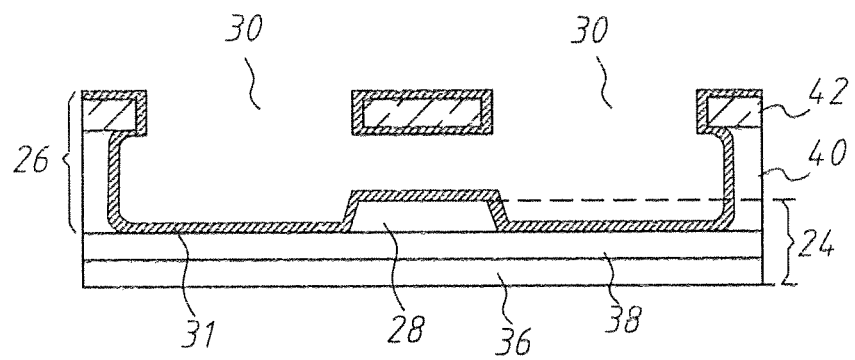
Figure 3E:
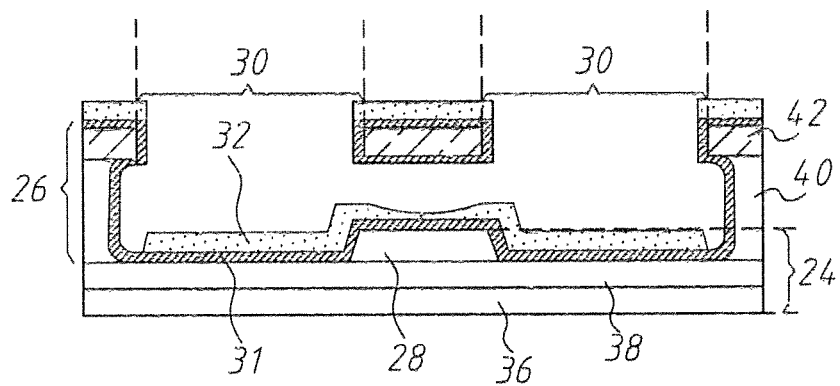
Figure 3F:
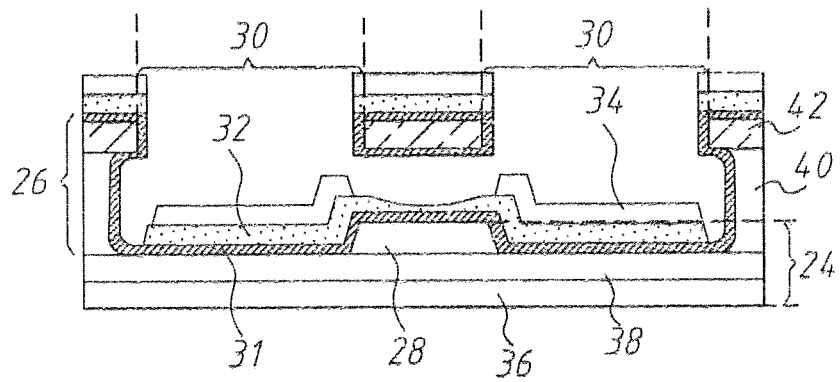
Figure 3G:
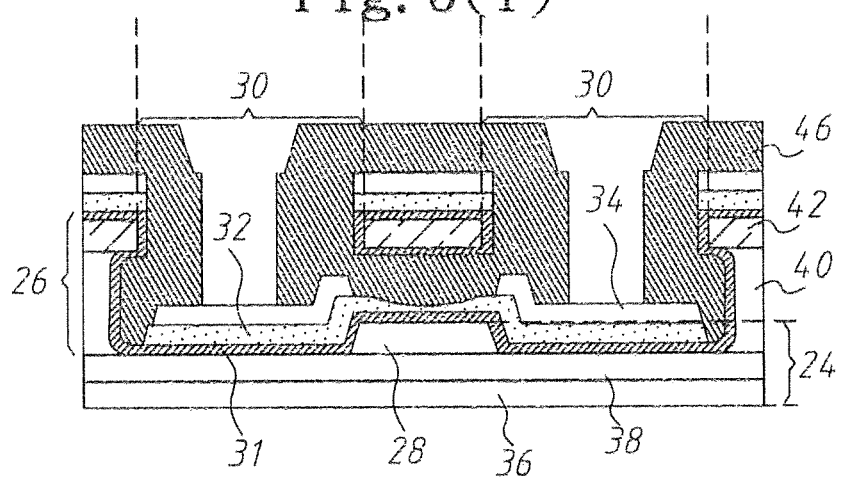
Figure 3H:
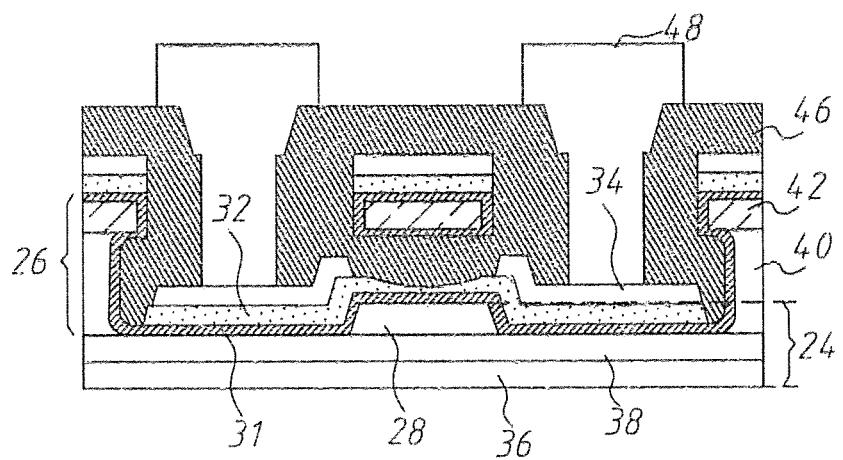
Figure 4:
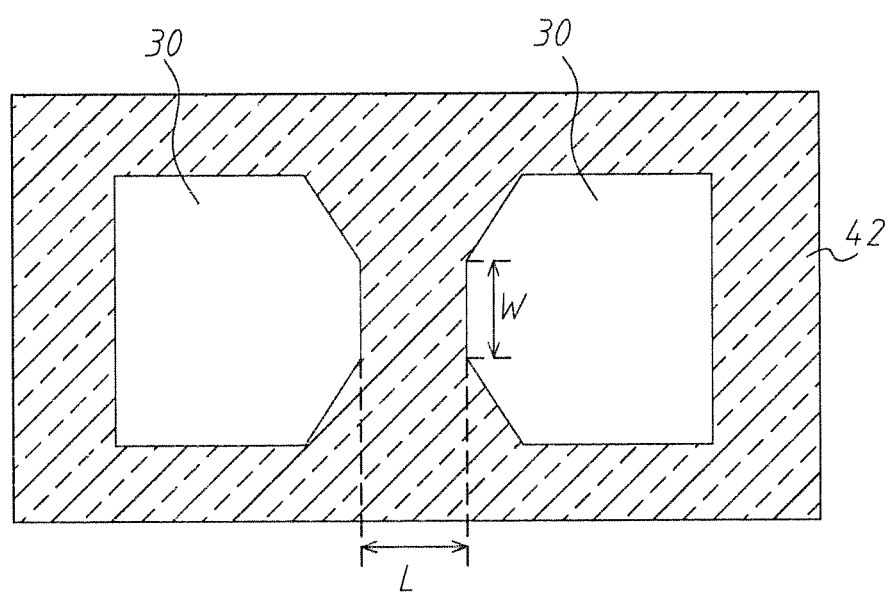
FIG. 4 is a top view schematically showing a hard mask layer according to the first embodiment of the present invention.

In the abovementioned fabrication process, if the gate-stacked structure 24 and the patterned dielectric mask structure 26 have been formed, the steps of FIGS. 3(a)-3(c) are omitted. As a result, the patterned dielectric mask structure 26 is directly formed on the gate-stacked structure 24 to cover the gate 28 of the gate-stacked structure 24, as shown in FIG. 3(d). Besides, the electrode blocks 34, the protection layer 46 and the conduction structures 48 of the first embodiment are lacked, and the steps of FIGS. 3(f)-3(h) are omitted.

Figure 5:
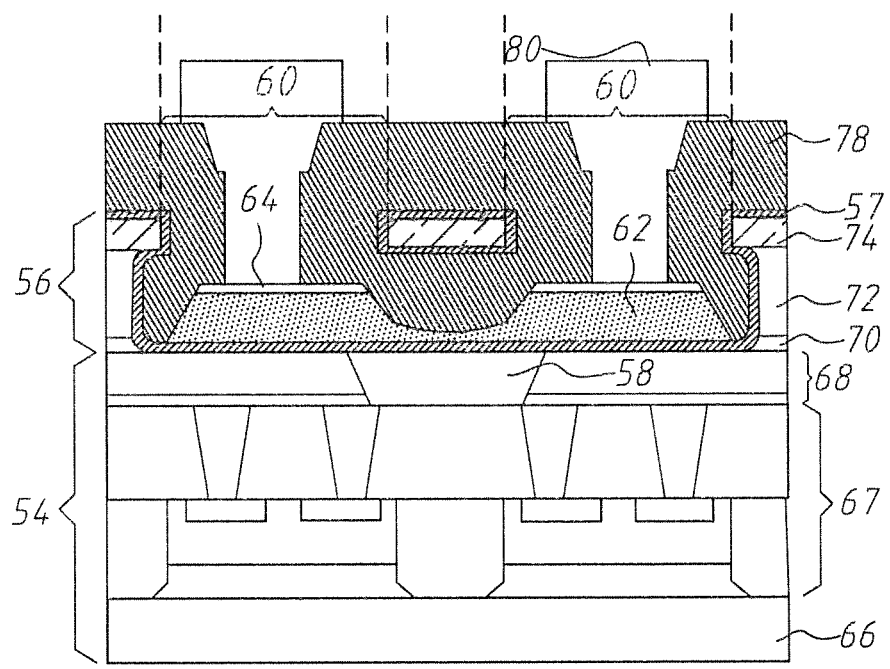
FIG. 5 is a sectional view schematically showing a thin-film transistor according to the second embodiment of the present invention.

The second embodiment of the present invention is introduced as below. Refer to FIG. 5. The second embodiment applies to fabricate an IC chip. The present invention comprises a gate-stacked structure 54. A patterned dielectric mask structure 56 is formed on the gate-stacked structure 24. A bottom of the patterned dielectric mask structure 56 has a gate dielectric layer 57 covering a gate 58 of the gate-stacked structure 54. A top surface of the patterned dielectric mask structure 56 has at least tow openings 60. A semiconductor layer 62 is formed on the gate dielectric layer 57 and comprises a channel above the gate 58, a source and a drain. The source and the drain are respectively positioned at two opposite sides of the channel. The channel connects with the source and the drain which are respectively positioned below the openings 30. The channel has a thickness which sequentially decreases from edge to center. The semiconductor layer 62 comprises metal oxide, such as Zinc Oxide (ZnO) or Indium Gallium Zinc Oxide (IGZO). Two electrode blocks 64 are respectively formed on the source and the drain. Material of the electrode blocks 64, for example, but not limited to aluminum, is used.

The gate-stacked structure 54 further comprises a substrate 66. A completed complementary metal-oxide-semiconductor (CMOS) circuit and a multi metal wire layer 68 are formed on the substrate 66. The multi metal wire layer 68 comprises a wire as the gate 58. The patterned dielectric mask structure 56 further comprises a protection layer 70 which is formed on the multi metal wire layer 68 of the gate-stacked structure 54 to expose the gate 58. A patterned sacrifice layer 72 is formed on the protection layer 70. A hard mask layer 74 with two openings 60 is formed on the patterned sacrifice layer 72. Material of the hard mask layer 74, for example, but not limited to nitride, is used. The gate dielectric layer 57 is formed on the surfaces of the multi metal wire layer 68 of the gate-stacked structure 54, the protection layer 70, the gate 58, the patterned sacrifice layer 72 and the hard mask layer 74. The semiconductor layer 62 is formed on the gate dielectric layer 57. A protection layer 78 is formed on the electrode blocks 64, the semiconductor layer 62 and the gate dielectric layer 57 of the patterned dielectric mask structure 56 to expose parts of the two electrode blocks 64. At least one conduction structure 80 is formed on the protection layer 78 to connect with the electrode blocks 64. At least one conduction structure 80 is exemplified by two conduction structure 80.

Figure 6A:
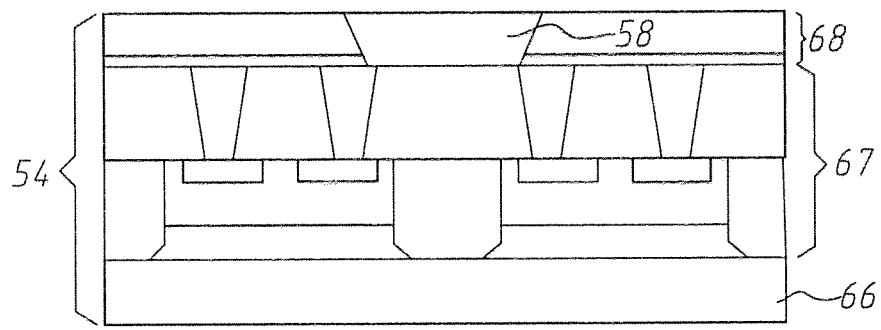
FIGS. 6(a)-6(h) are sectional views schematically showing the steps of fabricating the thin-film transistor according to the second embodiment of the present invention.
Figure 6B:
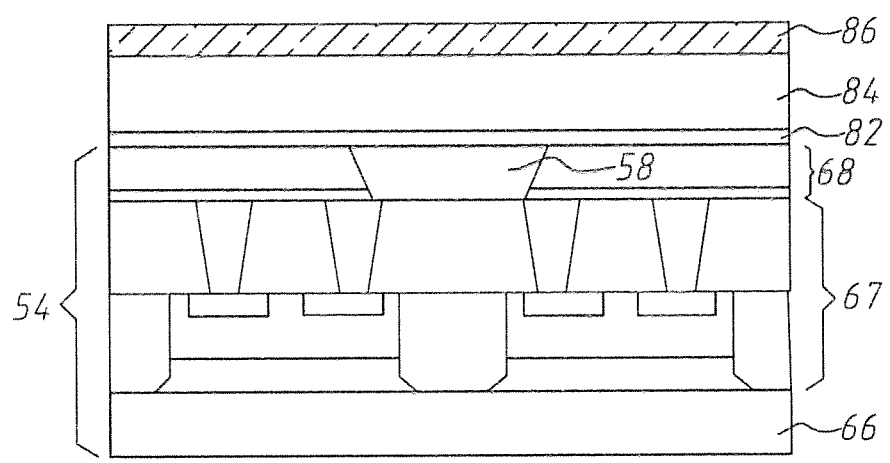

The process for fabricating the second embodiment is introduced as below. Refer to FIGS. 6(a)-6(h). Firstly, as shown in FIG. 6(a), the substrate 66 is provided, and then the CMOS circuit 67 and the multi metal wire layer 68 comprising the wire as the gate 58 are sequentially formed on the substrate 66 to obtain the gate-stacked structure 54. Next, as shown in FIG. 6(b), a protection layer 82, a sacrifice layer 84 and a hard mask layer 86 are sequentially formed on the multi metal wire layer 68 and the gate 58 of the gate-stacked structure 54. Then, the hard mask layer 86 is etched to have the two openings 60 by a dry etching method, thereby forming the hard mask layer 74 shown in FIG. 6(c). Also, the sacrifice layer 84 the protection 82 below the openings 60 and above the gate 58 is removed by a wet etching method and isotropic etching to expose the gate 58, thereby forming the patterned sacrifice layer 72 and the protection layer 70 shown in FIG. 6(c). FIG. 7 shows a top view of the hard mask layer 74, wherein a cantilever between the two openings 60 has a length L and a width W which are respectively defined as a length and a width of a channel of a transistor. A distance between the cantilever and the substrate 66 is defined as H, L/H is about 1~2. Then, as shown in FIG. 6(d), the surfaces of the multi metal wire layer 68 and the gate 58 of the gate-stacked structure 54, the patterned sacrifice layer 72 and the hard mask layer 74 are covered with the gate dielectric layer 57, such that the patterned dielectric mask layer 56 is formed on the gate-stacked structure 54. The gate dielectric layer 57 is formed by chemical vapor deposition (CVD) or atomic layer deposition (ALD). Then, as shown in FIG. 6(e), the semiconductor layer 62 is formed on the gate dielectric layer 57 of the patterned dielectric mask structure 56 through the openings 30 by a sputtering method under a pressure between $10^{-3}$~$10^{-2}$ torr. The semiconductor layer 62 comprises a channel above the gate 58, a source and a drain. The source and the drain are respectively positioned at two opposite sides of the channel. The channel has a thickness which sequentially decreases from edge to center. Due to the scattering effect, the channel is formed below the cantilever of the hard mask layer 42 to connect with the source and the drain. Then, as shown in FIG. 6(f), the two electrode blocks 64 are respectively formed on the source and the drain through the openings 30 by a thermal evaporation method under a pressure lower than $10^{-5}$ torr, a collimating sputtering method or an ionized metal plasma sputtering method. Due to the fact that the pressure is low enough or the deposit has verticality properties, the film formed below the cantilever is opened. Then, as shown in FIG. 6(g), the protection layer 78 is formed on the two electrode blocks 64, the semiconductor layer 62 and the gate dielectric layer 57 of the patterned dielectric mask structure 56 to expose the parts of the two electrode blocks 64. Finally, as shown in FIG. 6(h), the conduction structures 80 are formed on the protection layer 78 to connect with the two electrode blocks 64. Since the patterned dielectric mask structure 56 is directly formed on the gate-stacked structure 54, the channel, the source and the drain are formed in a self-assembled way without considering the problem of bending of the mask structure and the substrate themselves, thereby achieving the purpose the same to the first embodiment.

Figure 6C:
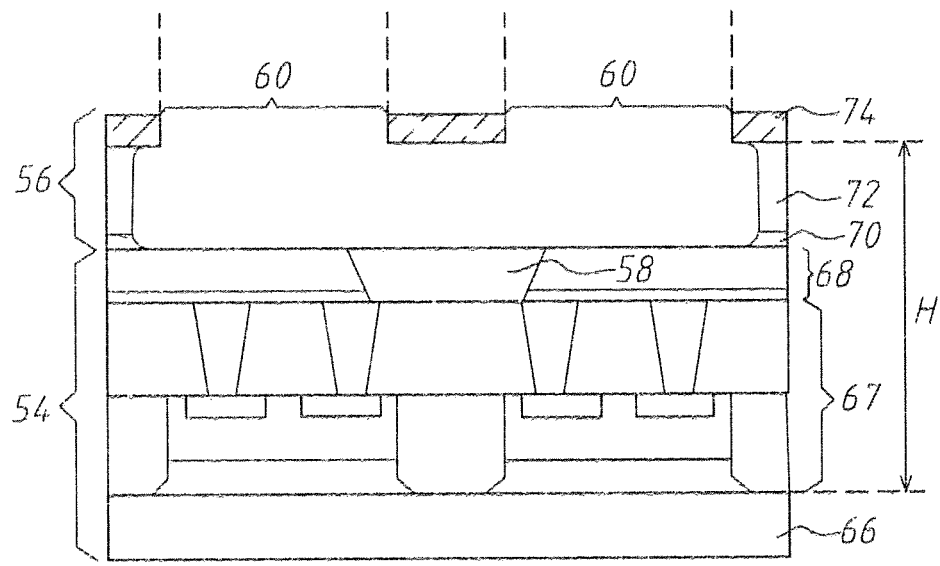
Figure 6D:
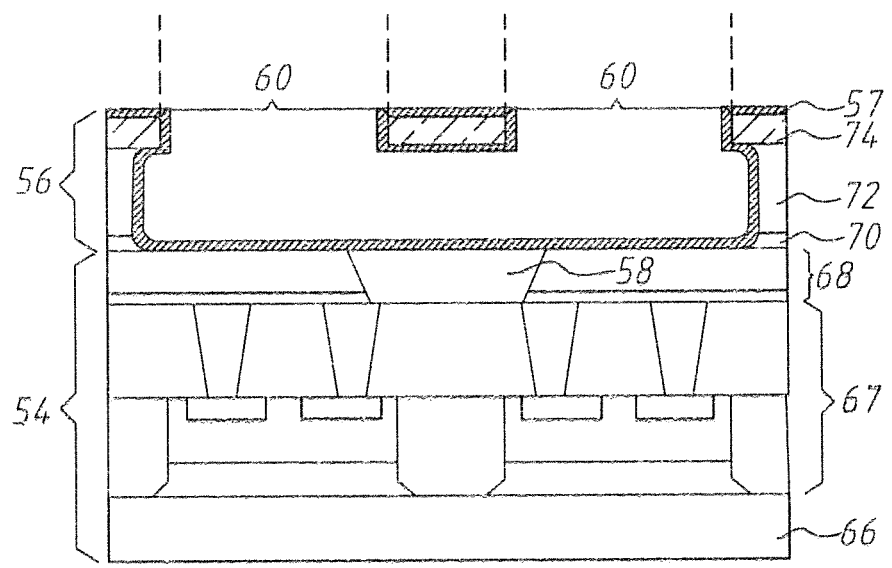
Figure 6E:
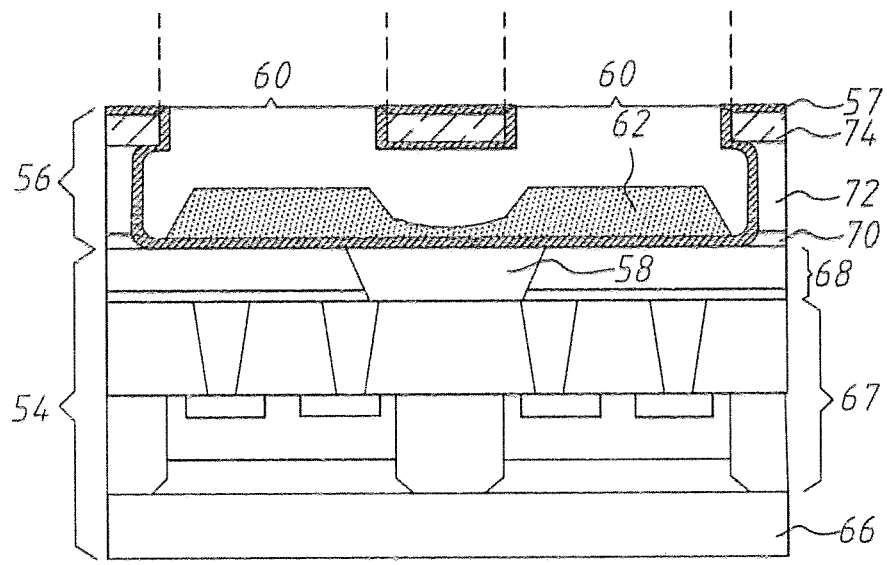
Figure 6F:
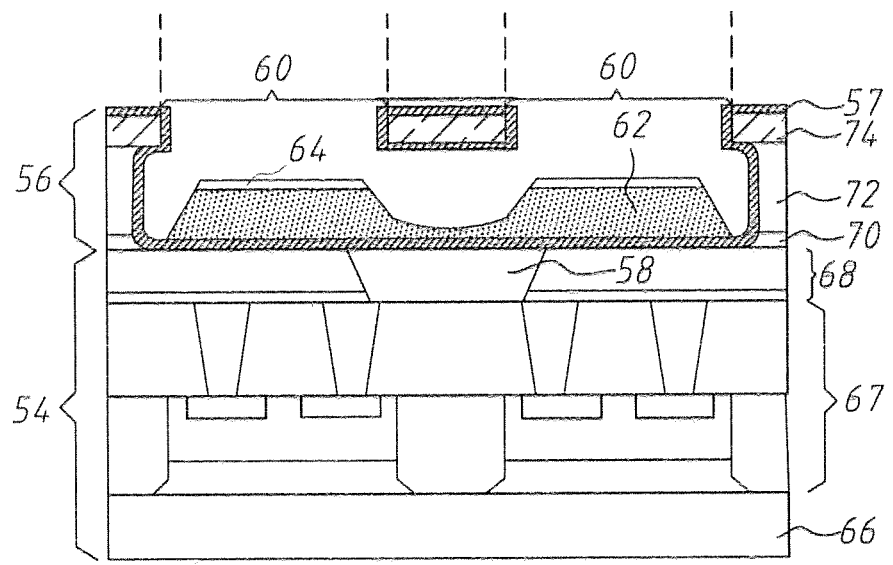
Figure 6G:
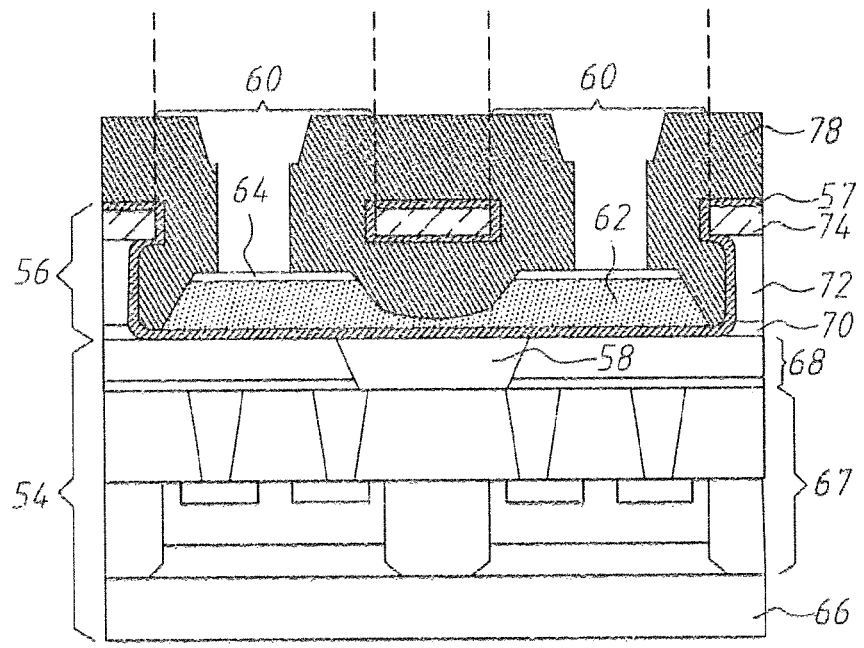
Figure 6H:
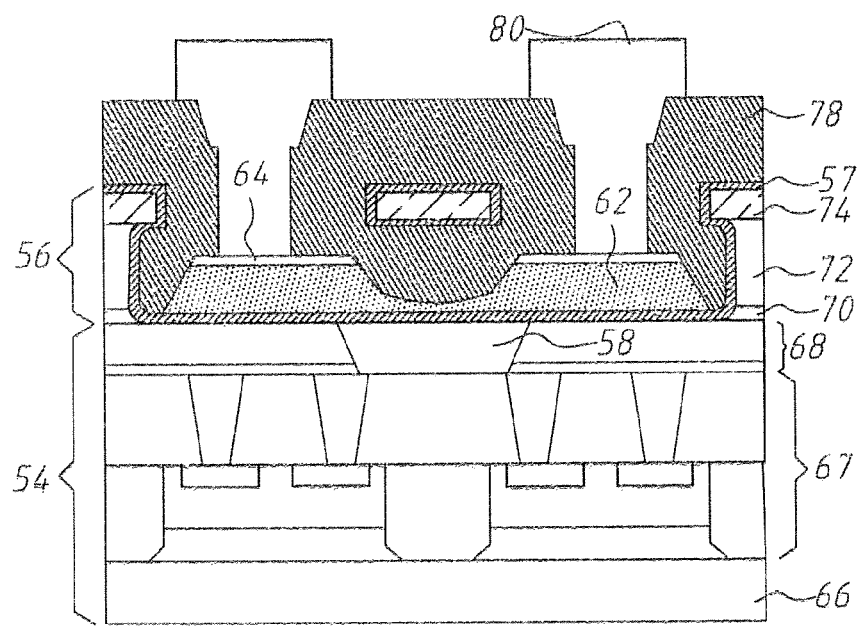
Figure 7:
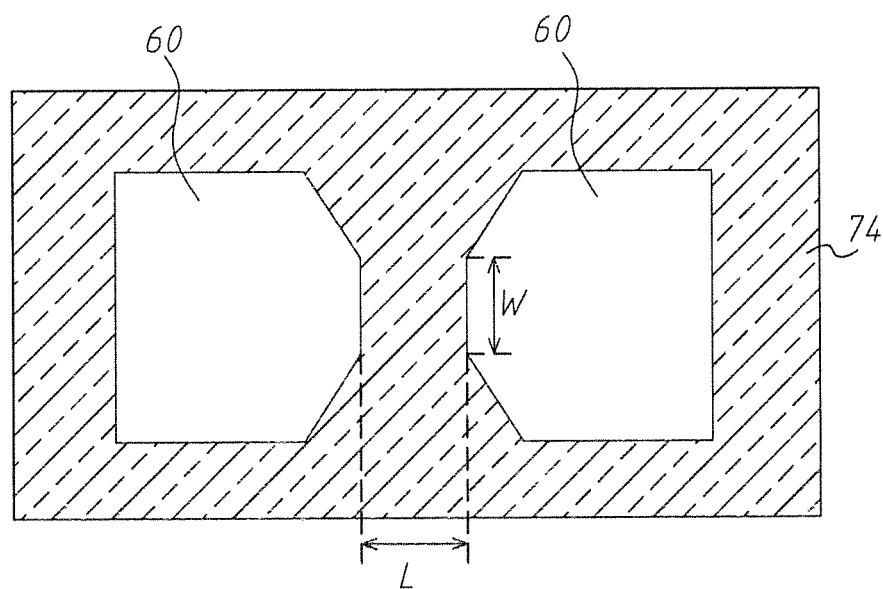
FIG. 7 is a top view schematically showing a hard mask layer according to the second embodiment of the present invention.

In the abovementioned fabrication process, if the gate-stacked structure 54 and the patterned dielectric mask structure 56 have been formed, the steps of FIGS. 6(a)-6(c) are omitted. As a result, the patterned dielectric mask structure 56 is directly formed on the gate-stacked structure 54 to cover the gate 58 of the gate-stacked structure 54, as shown in FIG. 6(d). Besides, the electrode blocks 64, the protection layer 78 and the conduction structures 80 of the second embodiment are lacked, and the steps of FIGS. 6(f)-6(h) are omitted.

Figure 8:
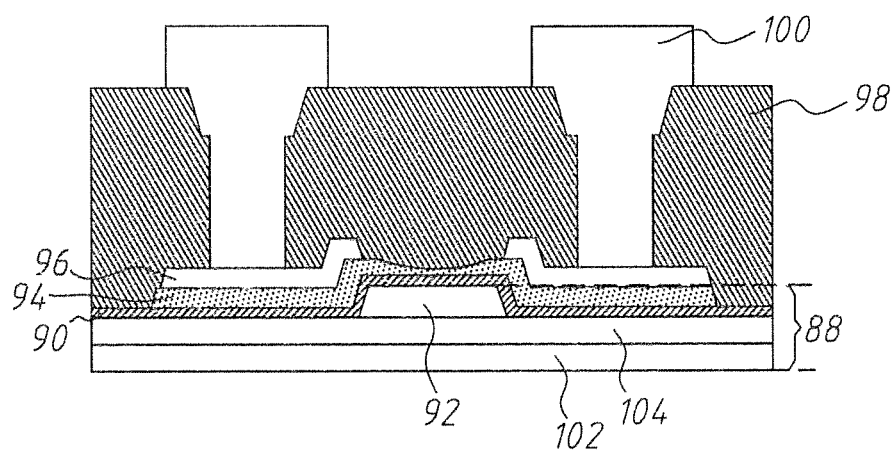
FIG. 8 is a sectional view schematically showing a thin-film transistor according to the third embodiment of the present invention.
Figure 9A:
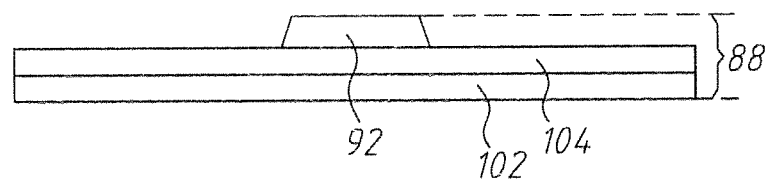
FIGS. 9(a)-9(h) are sectional views schematically showing the steps of fabricating the thin-film transistor according to the third embodiment of the present invention.
Figure 9B:
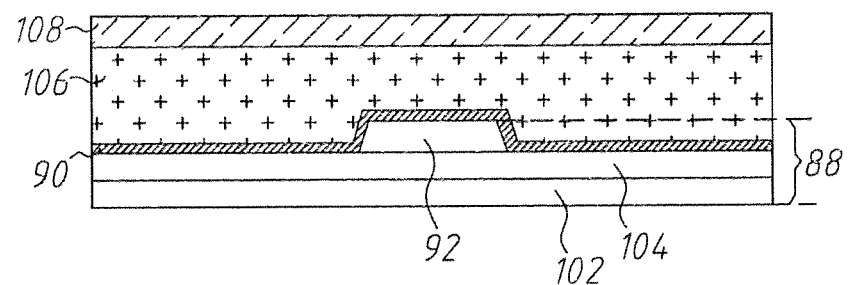
Figure 9C:
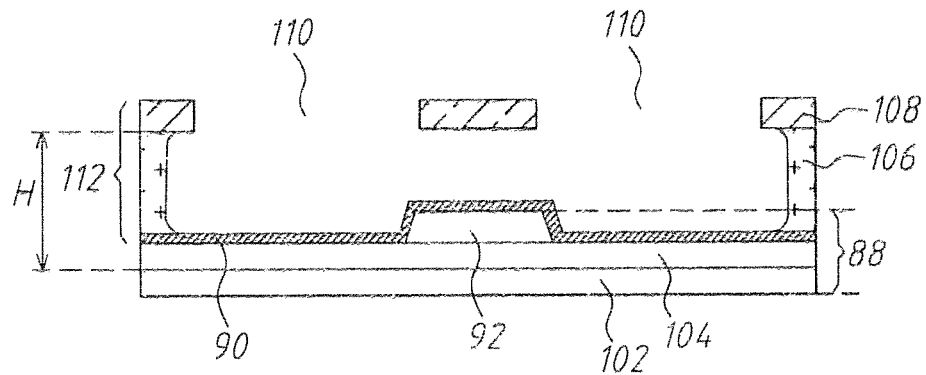
Figure 9D:
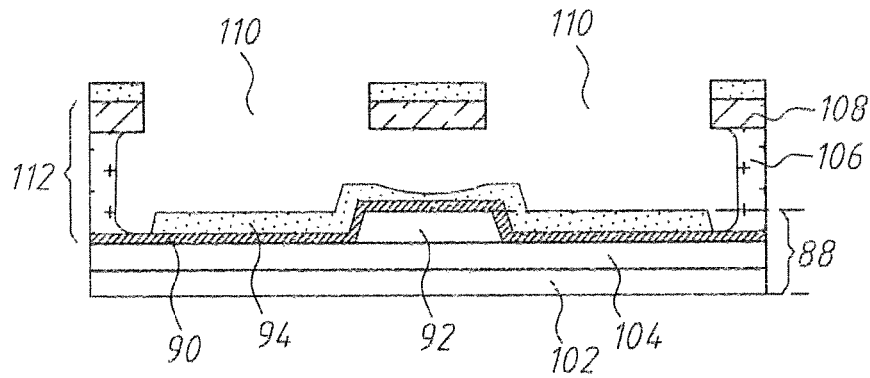
Figure 9E:
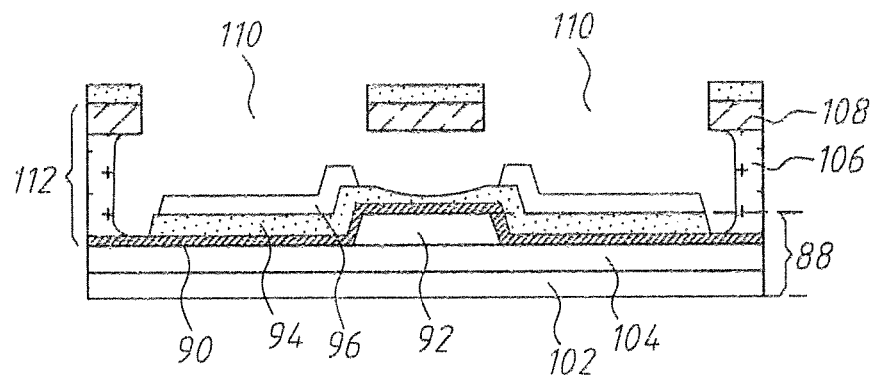
Figure 9F:
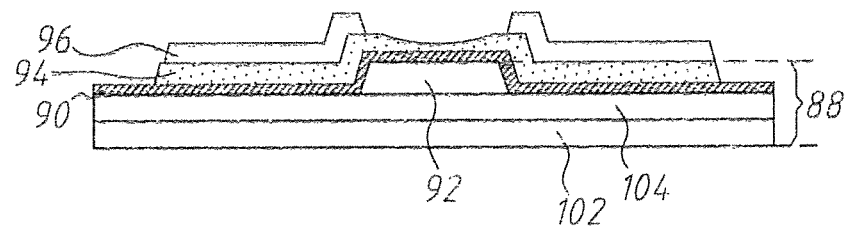
Figure 9G:
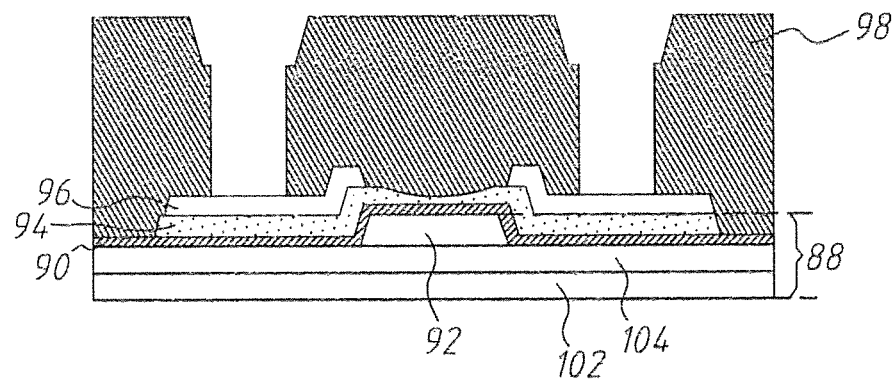
Figure 9H:
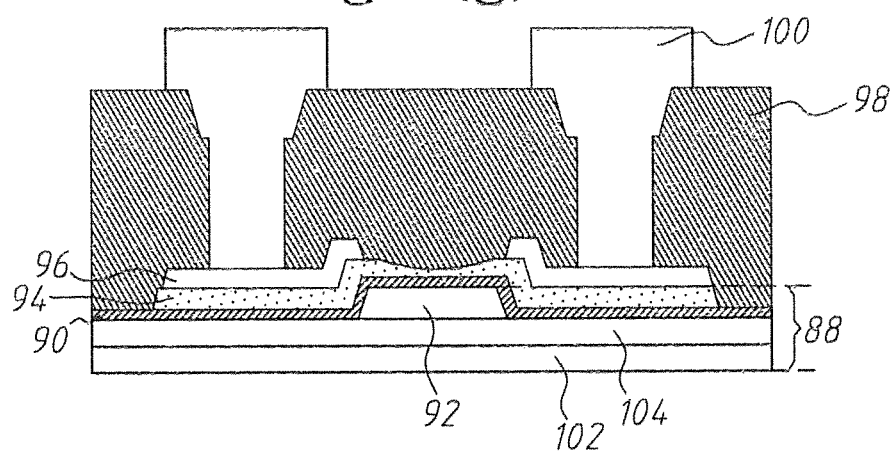

The third embodiment of the present invention is introduced as below. Refer to FIG. 8. The third embodiment applies to fabricate panels. The present invention comprises a gate-stacked structure 88. A gate dielectric layer 90 is formed on the gate-stacked structure 88 to cover a gate 92 of the gate-stacked structure 88. A semiconductor layer 94 is formed on the gate dielectric layer 90 and comprises a channel above the gate 92, a source and a drain. The source and the drain are respectively positioned at two opposite sides of the channel. The channel connects with the source and the drain. The channel has a thickness which sequentially decreases from edge to center. The semiconductor layer 94 comprises metal oxide, such as Zinc Oxide (ZnO) or Indium Gallium Zinc Oxide (IGZO). Two electrode blocks 96 are respectively formed on the source and the drain. Material of the electrode blocks 96, for example, but not limited to aluminum, is used. A protection layer 98 is formed on the electrode blocks 96, the semiconductor layer 94 and the gate dielectric layer 90 to expose parts of the electrode blocks 96. At least one conduction structure 100 is formed on the protection layer 98 to connect with the electrode blocks 96. At least one conduction structure 100 is exemplified by two conduction structure 100. In addition, the gate-stacked structure 88 further comprises a substrate 102 and an insulation layer 104 thereon. The gate 92 is formed on the insulation layer 104, and the gate dielectric layer 90 covers the insulation layer 104.

Figure 10:
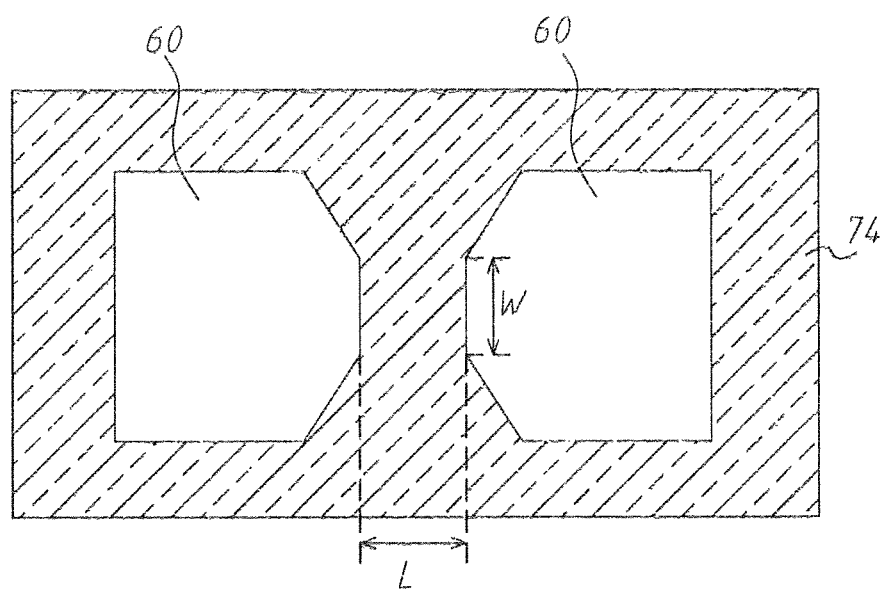
FIG. 10 is a top view schematically showing a hard mask layer according to the third embodiment of the present invention.

The process for fabricating the third embodiment is introduced as below. Refer to FIGS. 9(*a*)-9(*h*). Firstly, as shown in FIG. 9(*a*), the insulation layer 104 and the gate 92 are sequentially formed on the substrate 102 to obtain the gate-stacked structure 88. Next, as shown in FIG. 9(*b*), the gate dielectric layer 90, a baked photoresist layer 106 and a hard mask layer 108 are sequentially formed on the insulation layer 104 and the gate 92 of the gate-stacked structure 88. Alternatively, the photoresist layer 106 is replaced with an organic layer. Then, as shown in FIG. 9(*c*), the hard mask layer 108 is etched to have the two openings 110 by a dry etching method, and the photoresist layer 106 below the openings 110 and above the gate 92 is removed through the openings 110 by a reactive ion etching (RIE) method to expose the gate dielectric layer 90, thereby forming a patterned dielectric mask structure 112 on the gate-stacked structure 88. FIG. 10 shows a top view of the hard mask layer 108, wherein a cantilever between the two openings 110 has a length L and a width W which are respectively defined as a length and a width of a channel of a transistor. A distance between the cantilever and the substrate 102 is defined as H, L/H is about 1~2. Then, as shown in FIG. 9(*d*), the semiconductor layer 94 is formed on the gate dielectric layer 90 of the patterned dielectric mask structure 112 through the openings 110 by a sputtering method under a pressure between $10^{-3}$~$10^{-2}$ torr. The semiconductor layer 94 comprises a channel above the gate 92, a source and a drain. The source and the drain are respectively positioned at two opposite sides of the channel. The channel has a thickness which sequentially decreases from edge to center. Due to the scattering effect, the channel is formed below the cantilever of the hard mask layer 108 to connect with the source and the drain. Then, as shown in FIG. 9(*e*), the two electrode blocks 96 are respectively formed on the source and the drain through the openings 110 by a thermal evaporation method under a pressure lower than $10^{-5}$ torr, a collimating sputtering method or an ionized metal plasma sputtering method. Due to the fact that the pressure is low enough or the deposit has verticality properties, the film formed below the cantilever of the hard mask layer 108 is opened. Then, as shown in FIG. 9(*f*), the etched photoresist layer 106, and the hard mask layer 105 and the semiconductor layer 94 thereon are removed with organic solvents and a ultrasonic oscillator. Then, as shown in FIG. 9(*g*), the protection layer 98 is formed on the two electrode blocks 96, the semiconductor layer 94 and the gate dielectric layer 90 to expose the parts of the two electrode blocks 96. Finally, as shown in FIG. 9(*h*), the conduction structures 100 are formed on the protection layer 98 to connect with the two electrode blocks 96. The channel, the source and the drain are formed in a self-assembled way without considering the problem of bending of the substrate itself, thereby achieving the purpose the same to the first embodiment.

In the abovementioned fabrication process, if the gate-stacked structure 88 and the patterned dielectric mask structure 112 have been formed, the steps of FIGS. 9(*a*)-9(*b*) are omitted. As a result, the patterned dielectric mask structure 112 is directly formed on the gate-stacked structure 88 to cover the gate 92 of the gate-stacked structure 88, as shown in FIG. 9(*c*).

Figure 11:
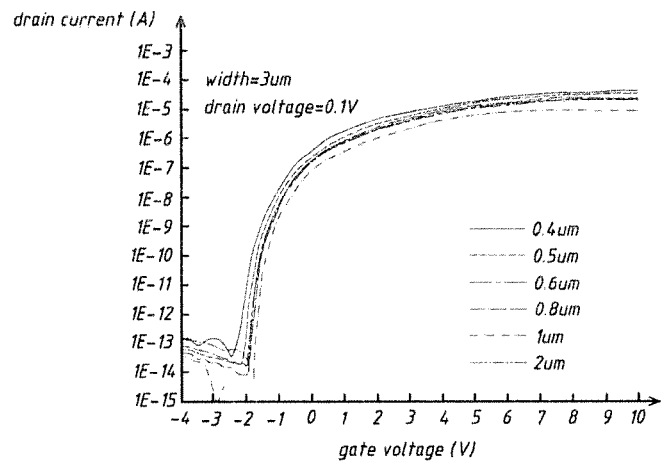
FIG. 11 and FIG. 12 are diagrams schematically showing a drain current and a gate voltage of a thin-film transistor biased at different drain voltages according to one embodiment of the present invention.
Figure 12:
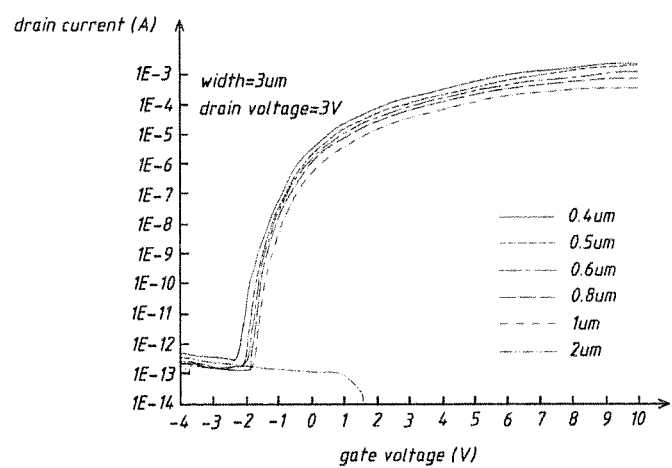

FIG. 11 and FIG. 12 are the device properties of experiments. The drain voltages of FIG. 11 and FIG. 12 are respectively 0.1 V and 3 V, and the length of the channel comprises 0.4 μm, 0.5 μm, 0.6 μm, 0.8 μm, 1 μm and 2 μm. Take the structure of FIG. 2 for example, and the width of channel is 3 μm, and the thickness of the gate dielectric layer 44 is 50 nm, and the channel is made of ZnO, and the Al electrodes are formed on the source and the drain. From the figures, $I_{on/off}$ is larger than $10^9$. In addition, L is 2 μm and the cantilever of the hard mask layer 42 is too long, thus the ZnO film below the cantilever is not connected and the drain current is not generated. For the transistor with the channel length of 0.6 μm, the field-effect mobility is 19~33 cm$^2$/V-s. Further, according to the experiment results, the variability of properties of different devices (with an identical L) on the whole wafer is very low. Therefore, the method of the present invention possesses well-controlled properties and uniformity for fabrication process.

In conclusion, the present invention possesses more process flexibility and fabricates the deep sub-micrometer transistors with high uniformity.

The embodiments described above are only to exemplify the present invention but not to limit the scope of the present invention. Therefore, any equivalent modification or variation according to the shapes, structures, features, or spirit disclosed by the present invention is to be also included within the scope of the present invention.

What is claimed is:

1. A method for fabricating a thin-film transistor comprises steps of:
   forming a patterned dielectric mask structure on a gate-stacked structure to cover a gate of said gate-stacked structure, and a top surface of said patterned dielectric mask has at least two openings which are respectively positioned above two areas at two opposite sides of said gate; and
   forming a semiconductor layer on said patterned dielectric mask structure via said openings, and said semiconductor layer comprises a channel above said gate, a source and a drain, and said drain and said source are respectively positioned at two opposite sides of said channel, and said channel has a thickness which sequentially decreases from edge to center.

2. The method for fabricating the thin-film transistor of claim 1, wherein said gate-stacked structure is fabricated with a method comprising steps of:
   forming an insulation layer on a substrate; and
   forming said gate on said insulation layer to obtain said gate-stacked structure.

3. The method for fabricating the thin-film transistor of claim 2, wherein said step of forming said patterned dielectric mask structure on said gate-stacked structure further comprises steps of:
   sequentially forming a sacrifice layer and a hard mask layer on said gate-stacked structure;
   removing said hard mask layer to have said openings and removing said sacrifice layer below said opening to expose said gate through said openings; and
   covering a gate dielectric layer on surfaces of said gate-stacked structure, said gate, said sacrifice layer and said hard mask layer to form said patterned dielectric mask structure on said gate-stacked structure.

4. The method for fabricating the thin-film transistor of claim 1, wherein said gate-stacked structure is fabricated with a method comprising steps of:
provided a substrate; and
forming a multi metal wire layer comprising a wire as said gate on said substrate to obtain said gate-stacked structure.

5. The method for fabricating the thin-film transistor of claim 4, wherein said step of forming said patterned dielectric mask structure on said gate-stacked structure further comprises steps of:
sequentially forming a protection layer, a sacrifice layer and a hard mask layer on said gate-stacked structure;
removing said hard mask layer to have said openings and removing said sacrifice layer and said protection layer below said openings to expose said gate through said openings; and
covering a gate dielectric layer on surfaces of said gate-stacked structure, said protection layer, said gate, said sacrifice layer and said hard mask layer to form said patterned dielectric mask structure on said gate-stacked structure.

6. The method for fabricating the thin-film transistor of claim 1, further comprises steps of:
respectively forming two electrode blocks on said source and said drain through said openings;
forming a protection layer on said electrode blocks, said semiconductor layer and said patterned dielectric mask structure and exposing parts of said electrode blocks; and
forming at least one conduction structure on said protection layer to connect with said electrode blocks.

7. The method for fabricating the thin-film transistor of claim 6, wherein said electrode blocks are formed by a thermal evaporation method under a pressure lower than $10^{-5}$ torr.

8. The method for fabricating the thin-film transistor of claim 6, wherein said electrode blocks are formed by a collimating sputtering method.

9. The method for fabricating the thin-film transistor of claim 6, wherein said electrode blocks are formed by an ionized metal plasma sputtering method.

10. The method for fabricating the thin-film transistor of claim 1, wherein said step of forming said patterned dielectric mask structure on said gate-stacked structure further comprises steps of:
sequentially forming a gate dielectric layer, a photoresist layer and a hard mask layer on said gate-stacked structure; and
removing said hard mask layer to have said openings and removing said photoresist layer below said openings to expose said gate dielectric layer, whereby said patterned dielectric mask structure is formed on said gate-stacked structure.

11. The method for fabricating the thin-film transistor of claim 10, wherein further comprises steps of:
respectively forming two electrode blocks on said source and said drain through said openings;
removing said photoresist layer, and said hard mask layer and said semiconductor layer thereon
forming a protection layer on said electrode blocks, said semiconductor layer and said patterned dielectric mask structure and exposing parts of said electrode blocks; and
forming at least one conduction structure on said protection layer to connect with said electrode blocks.

12. The method for fabricating the thin-film transistor of claim 11, wherein said electrode blocks are formed by a thermal evaporation method under a pressure lower than $10^{-5}$ torr.

13. The method for fabricating the thin-film transistor of claim 11, wherein said electrode blocks are formed by a collimating sputtering method.

14. The method for fabricating the thin-film transistor of claim 11, wherein said electrode blocks are formed by an ionized metal plasma sputtering method.

15. The method for fabricating the thin-film transistor of claim 1, wherein said semiconductor layer is formed by a sputtering method under a pressure between $10^{-3}$ and $10^{-4}$ torr.

16. The method for fabricating the thin-film transistor of claim 1, wherein said semiconductor layer comprises Zinc Oxide (ZnO) or Indium Gallium Zinc Oxide (IGZO).

* * * * *